United States Patent
Kim et al.

(10) Patent No.: US 10,922,170 B2
(45) Date of Patent: Feb. 16, 2021

(54) MEMORY MODULE INCLUDING A VOLATILE MEMORY DEVICE, MEMORY SYSTEM INCLUDING THE MEMORY MODULE AND METHODS OF OPERATING A MULTI-MODULE MEMORY DEVICE

(71) Applicant: Samsung Electronics Co., Ltd., Suwon-si (KR)

(72) Inventors: Dae-Jeong Kim, Seoul (KR); Sung-Joon Kim, Hwaseong-si (KR); Wonjae Shin, Seoul (KR); Yongjun Yu, Suwon-si (KR); Changmin Lee, Hwaseong-si (KR); Insu Choi, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/412,468

(22) Filed: May 15, 2019

(65) Prior Publication Data

US 2020/0174882 A1    Jun. 4, 2020

(30) Foreign Application Priority Data

Dec. 3, 2018   (KR) ........................ 10-2018-0153637

(51) Int. Cl.
| | | |
|---|---|---|
| *G11C 29/00* | (2006.01) | |
| *G06F 11/10* | (2006.01) | |
| *G11C 11/406* | (2006.01) | |
| *G11C 11/00* | (2006.01) | |
| *G11C 29/52* | (2006.01) | |

(52) U.S. Cl.
CPC ...... *G06F 11/1068* (2013.01); *G06F 11/1004* (2013.01); *G11C 11/005* (2013.01); *G11C 11/406* (2013.01); *G11C 29/52* (2013.01)

(58) Field of Classification Search
CPC ............. G06F 11/1004; G06F 11/1068; G11C 11/005; G11C 11/406; G11C 29/52
See application file for complete search history.

(56) References Cited

U.S. PATENT DOCUMENTS

| | | |
|---|---|---|
| 7,609,576 B2 | 10/2009 | Watanabe et al. |
| 7,870,331 B2 | 1/2011 | Slitardja et al. |
| 8,161,355 B2 | 4/2012 | Fung et al. |
| 8,484,410 B2 | 7/2013 | Bains et al. |
| 9,053,813 B2 | 6/2015 | Kang et al. |
| 9,299,400 B2 | 3/2016 | Bains et al. |
| 9,448,866 B2 | 9/2016 | Ku |
| 10,193,576 B2 | 1/2019 | Eguchi |
| 2007/0250659 A1* | 10/2007 | Booth ................. G06F 13/4243 711/103 |

(Continued)

*Primary Examiner* — Albert Decady
*Assistant Examiner* — Enamul M Kabir
(74) *Attorney, Agent, or Firm* — Myers Bigel, P.A.

(57) ABSTRACT

A memory system includes a memory device having a plurality of volatile memory modules therein, and a memory controller, which is electrically coupled to the plurality of volatile memory modules. The memory controller is configured to correct an error in a first of the plurality of volatile memory modules in response to generation of an alert signal by the first of the plurality of volatile memory modules, concurrently with an operation to refresh at least a portion of a second of the plurality of volatile memory modules upon the generation of the alert signal.

15 Claims, 10 Drawing Sheets

(56) References Cited

U.S. PATENT DOCUMENTS

| | | | |
|---|---|---|---|
| 2011/0138261 A1* | 6/2011 | Bains | G06F 11/1016 |
| | | | 714/800 |
| 2013/0117641 A1* | 5/2013 | Bains | G06F 11/1016 |
| | | | 714/802 |
| 2013/0279284 A1* | 10/2013 | Jeong | G11C 11/40611 |
| | | | 365/222 |
| 2014/0013168 A1* | 1/2014 | Bains | G06F 11/10 |
| | | | 714/57 |
| 2014/0355332 A1* | 12/2014 | Youn | G11C 11/40615 |
| | | | 365/149 |
| 2016/0350002 A1 | 12/2016 | Vergis et al. | |
| 2017/0255383 A1* | 9/2017 | Chang | G06F 3/0625 |
| 2017/0344299 A1 | 11/2017 | Ivanov | |
| 2018/0136866 A1* | 5/2018 | Eugenio | G06F 11/22 |
| 2019/0043571 A1* | 2/2019 | Damle | G11C 29/50 |
| 2019/0235768 A1* | 8/2019 | Helmick | G06F 11/108 |
| 2019/0347157 A1* | 11/2019 | Waldrop | G11C 29/42 |

* cited by examiner

MEMORY MODULE INCLUDING A VOLATILE MEMORY DEVICE, MEMORY SYSTEM INCLUDING THE MEMORY MODULE AND METHODS OF OPERATING A MULTI-MODULE MEMORY DEVICE

REFERENCE TO PRIORITY APPLICATION

This application claims priority under 35 U.S.C. § 119 to Korean Patent Application No. 10-2018-0153637, filed Dec. 3, 2018, the disclosure of which is hereby incorporated herein by reference.

BACKGROUND

Embodiments of the inventive concept disclosed herein relate to semiconductor memory devices and, more particularly, to memory modules including volatile memory devices and a memory system including the memory module.

A semiconductor memory may include a volatile memory such as a dynamic random access memory or a static random access memory, and a nonvolatile memory such as a flash memory, a phase-change memory, a ferroelectric memory, a magnetic memory, or a resistive memory. In general, the volatile memory supports high-speed random access and is frequently used as a main memory of a computing system such as a personal computer, a server, or a workstation.

The volatile memory device may be included in each of a plurality of memory modules. The plurality of memory modules may be based on one of standards of a memory module such as a dual in-line memory module (DIMM). In this case, the plurality of memory modules may be inserted into a DIMM socket/slot directly connected with a processor of a computing system or a memory system and may provide fast operating speeds.

To secure accuracy of data to be exchanged, the memory system may perform error detection such as a parity check of a command/address or a cyclic redundancy check (CRC) of write data. In the case, whenever an error is detected from a signal provided to a specific memory module, the processor may perform a process for correcting the error, but may not allow a refresh operation(s) for all memory modules to be performed while an error associated with a specific memory module is being corrected. Accordingly, there is a need for processors and memory modules to support concurrent error correction operations and memory refresh operations.

SUMMARY

Embodiments of the inventive concept provide a memory module including a volatile memory device, for improving vulnerability of a refresh operation of any other memory module due to an operating state of a specific memory module and a memory system including the same.

According to an exemplary embodiment, a memory module includes a volatile memory device and a controller. The controller refreshes the volatile memory device in response to a first alert signal received from an alert pin. The controller detects an error of the volatile memory device, and outputs a second alert signal corresponding to the error to the alert pin.

According to an exemplary embodiment, a memory system includes a processor, a first memory module, and a second memory module. The processor may provide information. The first memory module may include a first volatile memory device, and a first controller that detects an error from the write information to be provided to the first volatile memory device and generates an alert signal corresponding to the detected error. The second memory module may include a second volatile memory device, and a second controller that refreshes the second volatile memory device in response to the alert signal. The processor may again provide the write information to the first memory module in response to the alert signal.

According to an exemplary embodiment, a memory system may include a first memory module, a second memory module, and a memory controller. The first memory module may include a nonvolatile memory device and a first controller that generates an alert signal based on an operating condition of the nonvolatile memory device. The second memory module may include a volatile memory device and a second controller that refreshes the volatile memory device in response to the alert signal.

According to a further embodiment of the inventive concept, a memory system is provided, which includes a memory device having a plurality of volatile memory modules therein, and a memory controller, which is electrically coupled to the plurality of volatile memory modules. The memory controller is configured to correct an error in a first of the plurality of volatile memory modules in response to generation of an alert signal by the first of the plurality of volatile memory modules, concurrently with an operation to refresh at least a portion of a second of the plurality of volatile memory modules upon the generation of the alert signal.

In some of these embodiments of the inventive concept, the controller may include an alert buffer circuit, which is configured to generate the alert signal as a second alert signal, in response to a first alert signal generated within the first of the plurality of volatile memory devices. In particular, this alert buffer circuit may include an output buffer configured to generate the second alert signal in response to the first alert signal, and an input buffer, which is disabled by the first alert signal. In addition, the output buffer may be disabled and the input buffer may be enabled when the first alert signal is inactive.

According to an additional embodiment of the inventive concept, a method of operating a memory device, having a plurality of volatile memory modules therein, is provided. This method includes generating a first alert signal in response to detecting an error in data in one of the plurality of volatile memory modules, and commencing a recovery operation to correct the data and an operation to refresh a second of the plurality of volatile memory modules, in-sync with a leading edge of the first alert signal. In addition, the commencing may be followed by generating a trailing edge of the first alert signal upon conclusion of the recovery operation. In some of these embodiments, the generating a first alert signal may include disabling an input path of an alert buffer circuit in-sync with a leading edge of the first alert signal. In particular, the generating a first alert signal may include generating second alert signal in-synch with the first alert signal, and the operation to refresh the second of the plurality of volatile memory modules may be preceded by transferring the second alert signal to the second of the plurality of volatile memory modules.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Below, embodiments of the inventive concept will be described clearly and in detail with reference to accompanying drawings to such an extent that an ordinary one in the art implements embodiments of the invention.

Figure 1:
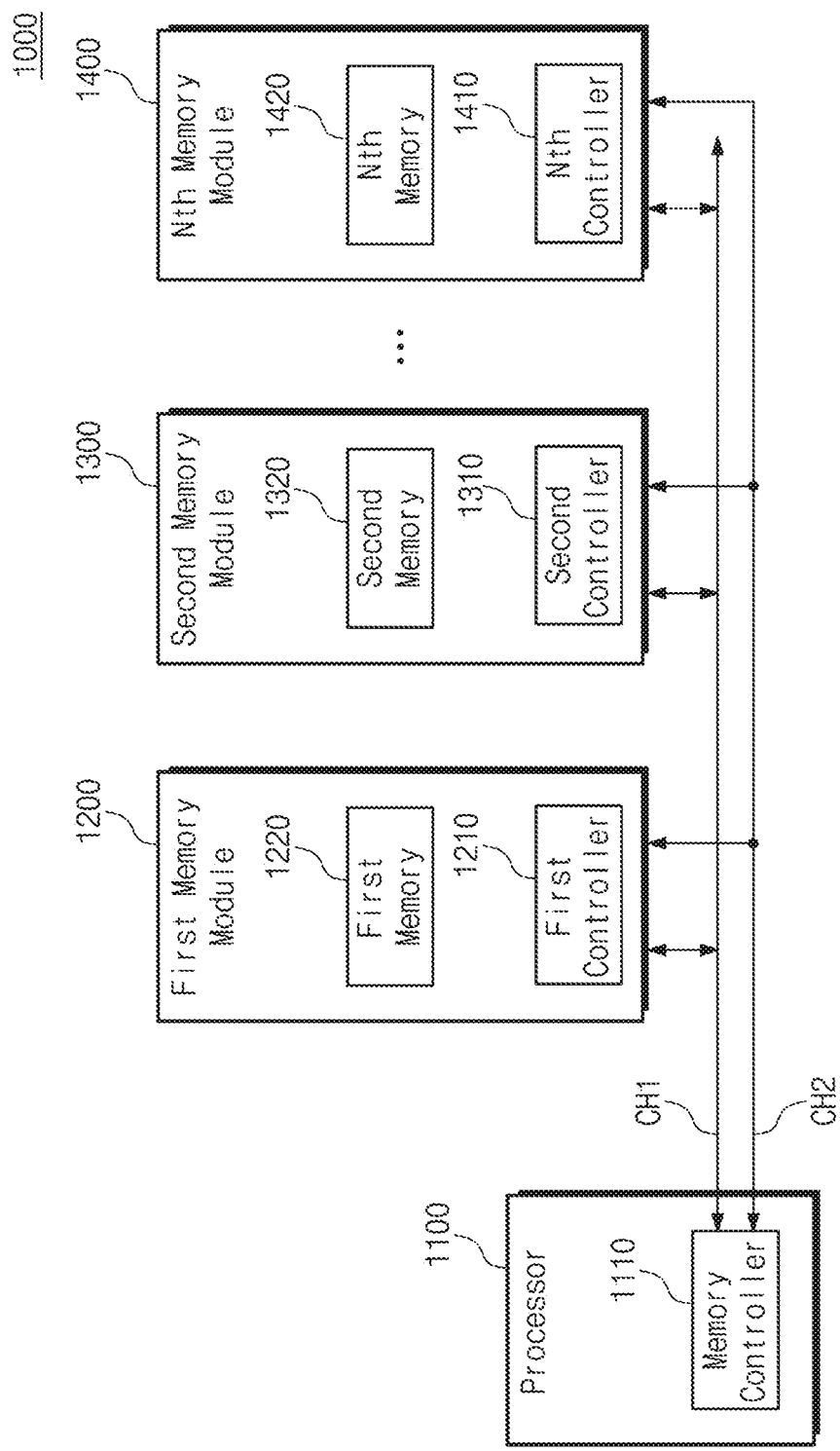
FIG. 1 is an exemplary block diagram of a memory system according to an embodiment of the inventive concept.

FIG. 1 is a block diagram illustrating a memory system 1000 according to an embodiment of the inventive concept. Referring to FIG. 1, the memory system 1000 may include a processor 1100 and first to n-th memory modules 1200 to 1400. For example, the memory system 1000 may be implemented in the form of a server such as an application server, a client server, or a data server. Alternatively, the memory system 1000 may be implemented in the form of a personal computer or a workstation.

The processor 1100 may control components of the memory system 1000 and operations of the components. The processor 1100 may execute an operating system and applications and may process data by using the operating system or the applications. The processor 1100 may include a memory controller 1110. However, the inventive concept is not limited thereto. For example, the memory controller 1110 may be positioned outside the processor 1100.

The memory controller 1110 may access the first to n-th memory modules 1200 to 1400 through a first channel CH1 or a second channel CH2. For example, the memory controller 1110 may include a register (not illustrated) for storing various information necessary to access the first to n-th memory modules 1200 to 1400. The memory controller 1110 may access the first to n-th memory modules 1200 to 1400 with reference to the information stored in the register.

The first to n-th memory modules 1200 to 1400 may be used as a main memory of the memory system 1000. The first to n-th memory modules 1200 to 1400 may communicate with the memory controller 1110 in compliance with one of standards of memory modules such as a dual in-line memory module (DIMM), a registered DIMM (RDIMM), and a load reduced DIMM (LRDIMM). The first to n-th memory modules 1200 to 1400 may include first to n-th controllers 1210 to 1410 respectively. Also, the first to n-th memory modules 1200 to 1400 may include first to n-th memories 1220 to 1420, respectively.

The first to n-th controllers 1210 to 1410 may receive an address, a command, a clock signal, and a control signal from the memory controller 1110. In each of the first to n-th memory modules 1200 to 1400, an access to the corresponding memory may be made based on the address, the command, the clock signal, and the control signal. As the address, the command, the clock signal, and the control signal are provided to the first to n-th memories 1220 to 1420 of the first to n-th memory modules 1200 to 1400, the first to n-th memory modules 1200 to 1400 may perform various operations including a write operation and a read operation on the first to n-th memory modules 1200 to 1400.

Each of the first to n-th memories 1220 to 1420 may include a storage space for storing data provided from the processor 1100. The first to n-th memories 1220 to 1420 may include a high-speed volatile memory, for example, a DRAM. However, the inventive concept is not limited thereto. For example, at least a part of the first to n-th memories 1220 to 1420 may include a different type of memory. For example, the first memory 1220 may include a flash memory, a phase change memory, a ferroelectric memory, a magnetic memory, or a resistive memory, and the second to n-th memories 1320 to 1420 may include a DRAM.

The first to n-th memory modules 1200 to 1400 may be connected to the memory controller 1110 through the first channel CH1 or the second channel CH2. The first channel CH1 may include channels for storing data in the first to n-th memory modules 1200 to 1400 or reading data from the first to n-th memory modules 1200 to 1400. The first channel CH1 may include channels respectively dedicated to the first to n-th memory modules 1200 to 1400.

The second channel CH2 may include channels for providing any other information other than data read from to be stored in the first to n-th memory modules 1200 to 1400. For example, the second channel CH2 may include a channel for providing an address or a command to the first to n-th memory modules 1200 to 1400. For example, the second channel CH2 may include an alert channel for providing the memory controller 1110 with an alert signal according to an operating state of any one of the first to n-th memory modules 1200 to 1400. For example, the operating state may be associated with whether an error is detected from information provided to a memory module. A memory module detecting an error may output the alert signal to the alert channel.

The second channel CH2 may not be dedicated to each of the first to n-th memory modules 1200 to 1400. The second channel CH2 may be shared by the memory controller 1110 and the first to n-th memory modules 1200 to 1400. For example, each of the first to n-th memory modules 1200 to 1400 may be electrically connected to one alert channel included in the second channel CH2 through an alert pin. In detail, the alert channel may receive the alert signal output by a memory module detecting an error based on a parity check of a command/address or a cyclic redundancy check (CRC) of write data. In general, a memory module may output a low pulse to the memory controller 1110 through the alert channel upon detecting an error.

Upon receiving the alert signal, the memory controller 1110 may perform an operation, which is set to process an error, such as retransmission of a command/address or data to the relevant memory module. While the set operation is performed, the memory controller 1110 may not direct any other operation to all the first to n-th memory modules 1200 to 1400. As such, a refresh operation of all memory modules for retaining data stored in dynamic random access memories may be delayed. In this case, a refresh operation may fail to be performed within a refresh periodic interval, and stability of the stored data may decrease.

To solve the vulnerability of the refresh operation described above, the first to n-th controllers 1210 to 1410 may trigger the alert signal to be provided through the alert channel to perform a refresh operation of a memory. An existing alert channel was used to provide only the alert signal to the memory controller 1110. That is, the existing memory module used the alert channel for the purpose of outputting the alert signal to the outside. However, the first to n-th memory modules 1200 to 1400 included in the memory system 1000 of the inventive concept may receive the alert signal from the outside and may perform a refresh operation based on the alert signal. This will be more fully described below.

Figure 2:
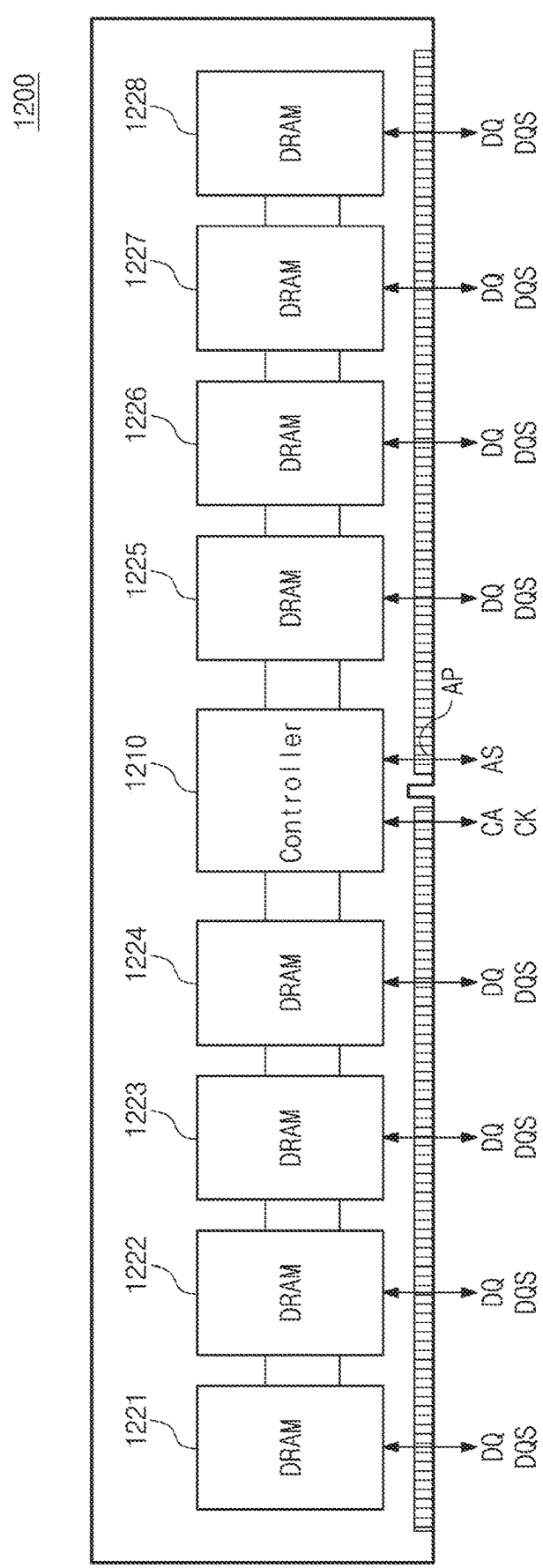
FIG. 2 is an exemplary diagram of a memory module of FIG. 1.

FIG. 2 is an exemplary diagram of a memory module of FIG. 1. The memory module 1200 illustrated in FIG. 2 may be at least one of the first to n-th memory modules 1200 to 1400 of FIG. 1. In an embodiment, the memory module 1200 may be a memory module complying with an RDIMM standard, but the inventive concept is not limited thereto. For example, the memory module 1200 may be a memory module complying with various standards such as an LRDIMM standard, an UDIMM standard, and an NVDIMM standard. Referring to FIG. 2, the memory module 1200 may include a controller 1210 and a plurality of volatile memory devices 1221 to 1228.

The controller 1210 corresponds to at least one of the first to n-th controllers 1210 to 1410 of FIG. 1. The controller 1210 may receive a command/address CA and a clock signal CK from the memory controller 1110 through the second channel CH2 of FIG. 1 and may provide the received signals to the plurality of volatile memory devices 1221 to 1228. The controller 1210 may include a register clock driver (RCD).

The controller 1210 may be connected with the alert channel included in the second channel CH2 through an alert pin AP. The controller 1210 may output an alert signal AS to the alert channel or may receive the alert signal AS from any other memory module through the alert channel. For example, the controller 1210 may detect an error based on a parity check of a command/address or a cyclic redundancy check of write data. When an error is detected, the controller 1210 may generate the alert signal AS and may output the alert signal AS to the alert channel. For example, the controller 1210 may receive the alert signal AS generated as an error detecting result of any other memory module. In this case, the controller 1210 may trigger the alert signal AS to perform a refresh operation on the plurality of volatile memory devices 1221 to 1228.

The plurality of volatile memory devices 1221 to 1228 are included in at least one of the first to n-th memories 1220 to 1420 of FIG. 1. The plurality of volatile memory devices 1221 to 1228 may include a DRAM. Each of the plurality of volatile memory devices 1221 to 1228 may communicate data DQ through the first channel CH1 of FIG. 1 in response to a signal provided from the controller 1210. The memory module 1200 may further include data buffers (not illustrated) for data communication, and the data buffers (not illustrated) may exchange the data DQ with the memory controller 1110 in synchronization with data strobe signals DQS. Unlike illustration of FIG. 2, the plurality of volatile memory devices 1221 to 1228 may communicate the data DQ with the memory controller 1110 through the controller 1210.

Figure 3:
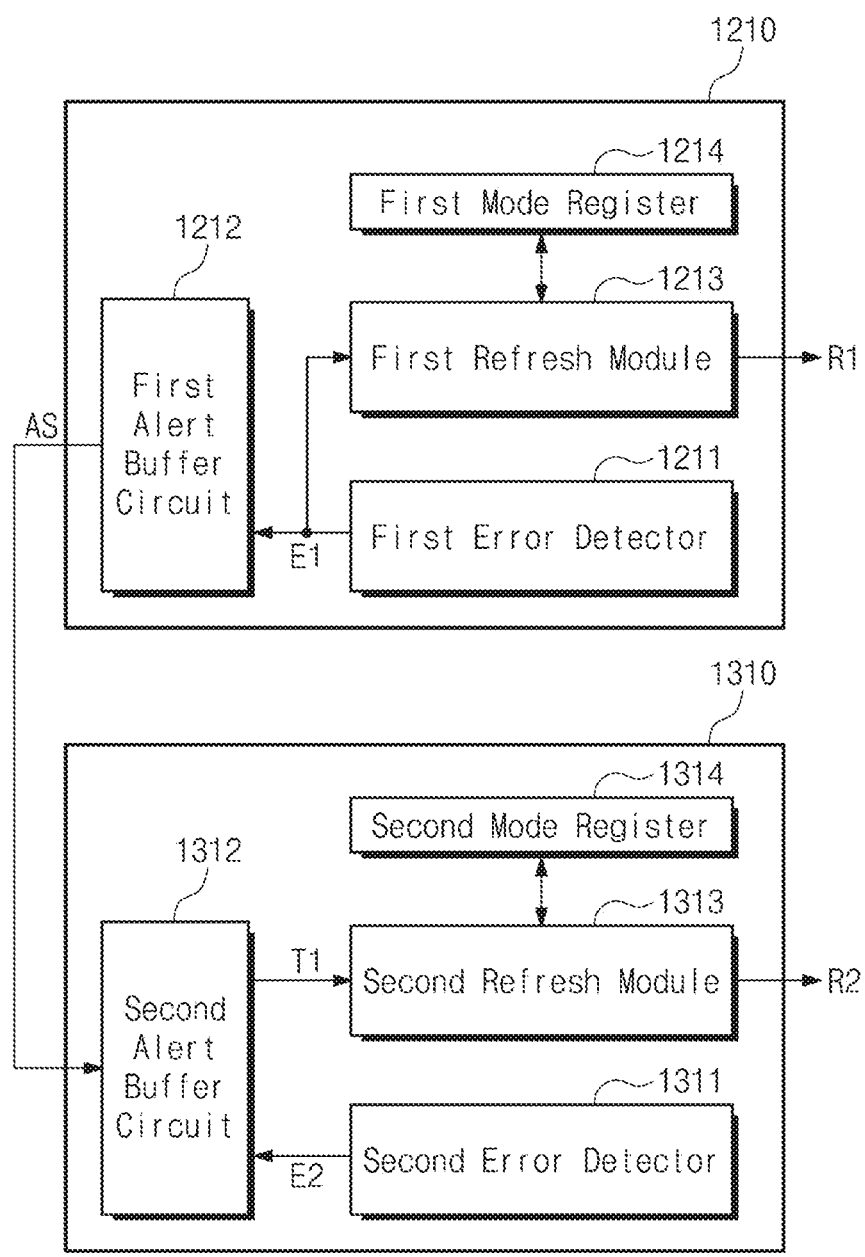
FIG. 3 is an exemplary block diagram of a controller included in a memory module illustrated in FIG. 1.

FIG. 3 is an exemplary block diagram of a controller included in a memory module illustrated in FIG. 1. FIG. 3 illustrates an example of the first controller 1210 and a second controller 1310 for describing how to generate the alert signal AS and perform a refresh operation according to the alert signal AS. Each of the first controller 1210 and the second controller 1310 may correspond to one of the first to n-th controllers 1210 to 1410 of FIG. 1. A memory corresponding to each of the first controller 1210 and the second controller 1310 may be understood as a volatile memory device such as a DRAM.

The first controller 1210 may include a first error detector 1211, a first alert buffer circuit 1212, a first refresh module 1213, and a first mode register 1214. It is assumed that the first controller 1210 is included in the first memory module 1200 of FIG. 1. For convenience of description, the components included in the first controller 1210 are illustrated as separate blocks, but the placement of the components included in the first controller 1210 is not so limited. For example, in the first memory module 1200, the first alert buffer circuit 1212 may be separated from any other components of the first controller 1210 and may be positioned adjacent to the alert pin AP.

The first error detector 1211 may detect an error by analyzing information (write information) provided to the first memory module 1200 from the memory controller 1110 of FIG. 1. For example, the write information may include a command, an address, and write data. For example, the command and the address may be provided to the first memory module 1200 from the second channel CH2 of FIG. 1, and the write data may be provided to the first memory module 1200 from the first channel CH1 of FIG. 1. The first error detector 1211 may detect an error occurring upon transmitting data by analyzing the write information.

For example, the first error detector 1211 may detect an error by analyzing a command/address provided to the first memory module 1200 from the memory controller 1110. For example, the first error detector 1211 may receive a parity bit together with a command/address from the memory controller 1110. The first error detector 1211 may perform a parity check of a command/address. The first error detector 1211 may detect an error by generating a parity bit based on the received command/address and comparing the parity bit received from the memory controller 1110 and the parity bit generated from the first controller 1210.

For example, the first error detector 1211 may detect an error by analyzing write data provided to the first memory module 1200 from the memory controller 1110. For example, the first error detector 1211 may receive write data together with a cyclic redundancy check (CRC) code from the memory controller 1110. The first error detector 1211 may perform a cyclic redundancy check (CRC) of the write data. The first error detector 1211 may detect an error by generating a CRC code based on the received write data and comparing the CRC code received from the memory controller 1110 and the CRC code generated from the first controller 1210.

When an error is detected, the first error detector 1211 may generate an error signal E1. When an error is not detected, the first error detector 1211 may generate a normal signal E2. For example, the error signal E1 may be an electrical signal having a high level, and the normal signal E2 may be an electrical signal having a low level. The error signal E1 is used to output the alert signal AS and is provided to the first alert buffer circuit 1212. Also, the error signal E1 may be provided to the first refresh module 1213.

The first alert buffer circuit 1212 outputs the alert signal AS to the alert channel, based on the error signal E1. The first alert buffer circuit 1212 is electrically connected to the alert channel. When an error is detected, the first alert buffer circuit 1212 may operate as an output buffer for outputting the alert signal AS. In this case, the first alert buffer circuit 1212 may prevent a signal provided to the first memory module 1200 through the alert channel from being received. When an error is not detected, the first alert buffer circuit 1212 may operate as an input buffer for receiving an alert signal provided from any other memory module through the alert channel. As such, it may be possible to recognize an operating state of any other memory module, for example, an occurrence of an error. In this case, the first alert buffer circuit 1212 may prevent a signal from being output to the alert channel.

The first refresh module 1213 may allow the first memory 1220 to perform a refresh operation, based on the error signal E1 or the alert signal provided from the outside. The first refresh module 1213 may receive the error signal E1 generated from the first error detector 1211 and may trigger the error signal E1 to generate a first refresh signal R1 for refreshing the first memory 1220.

The refresh operation may be performed together with an operation set to process an error upon detecting the error, but the inventive concept is not limited thereto. For example, the refresh operation may be performed after the memory controller 1110 processes an error. In this case, the first refresh module 1213 may not receive the error signal E1 and may perform the refresh operation based on a refresh command by the memory controller 1110.

The first mode register 1214 may store information necessary to perform various operating modes of the first memory module 1200. The first mode register 1214 may store various information necessary for a refresh operation of the first memory 1220. For example, a time to perform a refresh operation, a refresh period, the number of times a refresh operation is to be performed, a value of counting a refresh operation, etc. may be stored in the first mode register 1214. The information stored in the first mode register 1214 may be changed. Also, a refresh time or count may be adjusted according to a processing time of an error. The first refresh module 1213 may perform the refresh operation with reference to the information stored in the first mode register 1214.

The second controller 1310 may include a second error detector 1311, a second alert buffer circuit 1312, a second refresh module 1313, and a second mode register 1314. It is assumed that the second controller 1310 is included in the second memory module 1300 of FIG. 1. The second error detector 1311, the second alert buffer circuit 1312, the second refresh module 1313, and the second mode register 1314 may be substantially identical to the first error detector 1211, the first alert buffer circuit 1212, the first refresh module 1213, and the first mode register 1214.

The second error detector 1311 may detect an error based on a parity check of a command/address or a cyclic redundancy check (CRC). When an error is not detected, the second error detector 1311 may generate a normal signal E2. The normal signal E2 is provided to the second alert buffer circuit 1312. As the error signal E1 is provided to the first refresh module 1213, the normal signal E2 may be provided to the second refresh module 1313, but the normal signal E2 may not cause a refresh operation of the second refresh module 1313.

The second alert buffer circuit 1312 may receive the alert signal AS from the alert channel, based on the normal signal E2. As described with reference to the first alert buffer circuit 1212, when an error is not detected, the second alert buffer circuit 1312 may operate as an input buffer. Accordingly, the alert signal AS generated from the first controller 1210 may be recognized by the second controller 1310. The second alert buffer circuit 1312 may provide a trigger signal T1, which is generated based on the alert signal AS, to the second refresh module 1313.

The second refresh module 1313 may allow the second memory 1320 to perform a refresh operation, based on the alert signal AS. The second refresh module 1313 may trigger the trigger signal T1 generated based on the alert signal AS and may generate a second refresh signal R2 for refreshing the second memory 1320. Accordingly, even though an error occurs in the first memory module 1200, a refresh operation of the second memory module 1300 may not be delayed, and stability of data stored in the second memory 1320 may be secured. Also, when an error occurs, the second memory module 1300 may internally perform the refresh operation, and thus, a burden on a control of the memory controller 1110 may decrease. The second refresh module 1313 may perform the refresh operation with reference to the information stored in the second mode register 1314.

For example, the second refresh module 1313 may perform an auto refresh operation on the second memory 1320, based on the alert signal AS. The refresh operation may be performed once, but the inventive concept is not limited thereto. For example, the second refresh module 1313 may perform the refresh operation as much as an operation count set to the second mode register 1314. The second refresh module 1313 may perform the refresh operation as much as the number of rows in the second memory 1320. After the refresh operation is performed on corresponding rows, the refresh operation may be performed on rows corresponding to a next address. This refresh operation may be repeated while increasing a counting value. A count of the refresh operation may be adjusted according to a refresh time, or may be adjusted by using a fuse or a mode register set.

For example, the second refresh module 1313 may perform a self-refresh operation on the second memory 1320, based on the alert signal AS. In the self-refresh operation, because a buffer for receiving a clock signal from the outside is deactivated, the memory controller 1110 fails to intervene in the second memory module 1300 until after the self-refresh operation is completed. Accordingly, the processor 1100 may have to recognize the self-refresh operation of the second refresh module 1313. For example, the processor 1100 may recognize the self-refresh operation of the second memory module 1300 through the alert signal AS, or the second memory module 1300 may directly notify the processor 1100 of the self-refresh operation. In this case, the processor 1100 may control a time of the self-refresh operation or a following process after the self-refresh operation, through the memory controller 1110.

Figure 4:
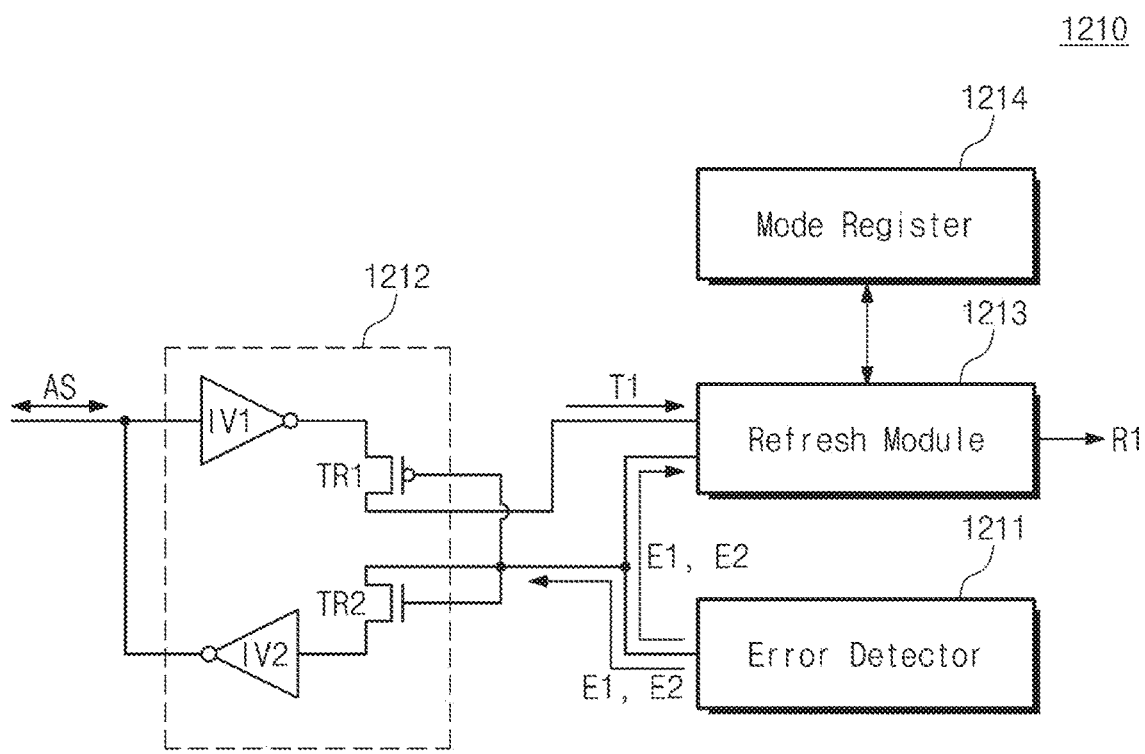
FIG. 4 is a diagram illustrating an example of a controller of FIG. 3.

FIG. 4 is a diagram illustrating an example of a controller of FIG. 3. The controller 1210 of FIG. 4 may be the first controller 1210 or the second controller 1310 of FIG. 3. Referring to FIG. 4, the controller 1210 may include the error detector 1211, the alert buffer circuit 1212, the refresh module 1213, and the mode register 1214. The error detector 1211, the refresh module 1213, and the mode register 1214 are identical to those described with reference to FIG. 3. The alert buffer circuit 1212 may be understood as a circuit operating as an input buffer or an output buffer based on whether an error is detected.

The alert buffer circuit 1212 may include an input buffer IV1, an output buffer IV2, a first transistor TR1, a second transistor TR2. When an error is detected, the error detector 1211 may output the error signal E1 of a high level. In this case, the first transistor TR1 may be turned off to deactivate the input buffer IV1, and the second transistor TR2 may be turned on to activate the output buffer IV2. The error signal E1 of the high level may be inverted through the output buffer IV2. As a result, the alert signal AS of a low pulse form may be output to the alert channel through an alert pin. Also, the error signal E1 may be provided to the refresh module 1213, and a refresh operation may be performed based on the error signal E1.

When an error is not detected, the error detector 1211 may output the normal signal E2 of a low level. In this case, the first transistor TR1 may be turned on to activate the input buffer IV1, and the second transistor TR2 may be turned off to deactivate the output buffer IV2. The alert signal AS of a low pulse form output from an external memory module may be received through the activated input buffer IV1. The alert signal AS may be inverted through the input buffer IV1. As a result, the trigger signal T1 of the high level may be provided to the refresh module 1213 so as to be triggered, and a refresh operation may be performed. The normal signal E2 of the low level may be input to the refresh module 1213, but may not cause a refresh operation.

Figure 5:
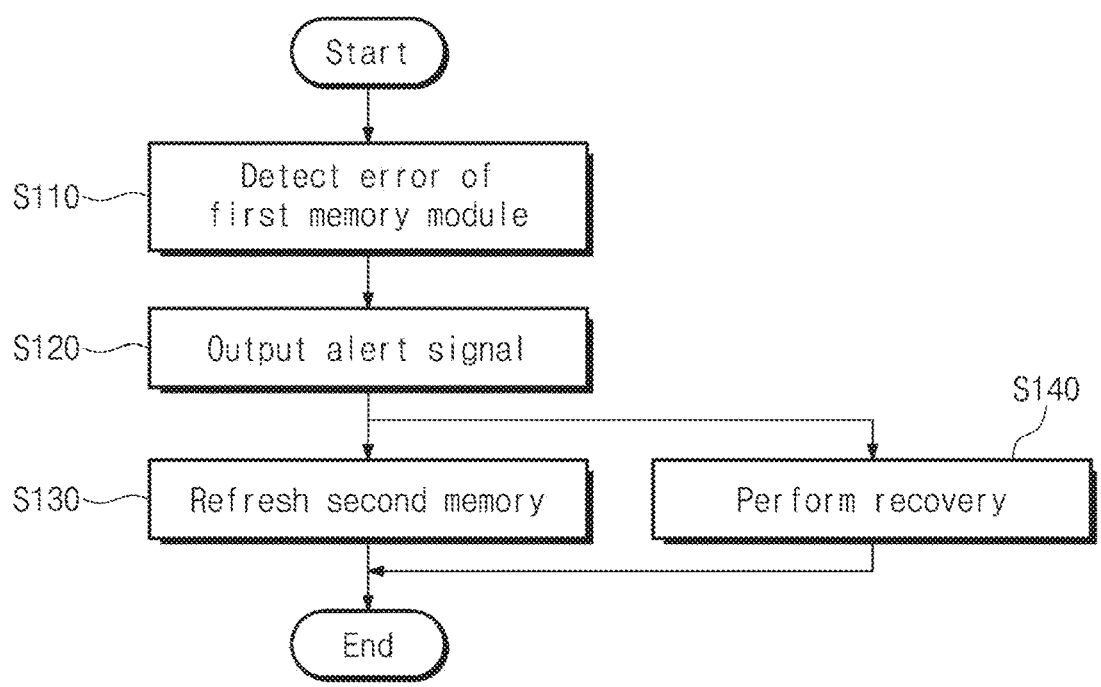
FIG. 5 is a flowchart associated with an operating method of a memory system of FIG. 1.

FIG. 5 is a flowchart associated with an operating method of a memory system of FIG. 1. A corresponding method may be performed by the memory system 1000 of FIG. 1. For convenience of description, FIG. 5 will be described with reference to reference marks/numerals of FIG. 1. In operation S110, the first memory module 1200 may detect an error. The first controller 1210 may detect an error through a parity check of a command/address or a cyclic redundancy check (CRC) of write data. When an error is detected, the first controller 1210 may generate an error signal for outputting an alert signal.

In operation S120, the first memory module 1200 may output the alert signal to the alert channel through an alert pin. For example, the first alert buffer circuit 1212 of FIG. 3 may output the alert signal, based on the received error signal. The output alert signal may be input to the second to n-th memory modules 1300 to 1400 and the memory controller 1110. It is assumed that the second memory module 1300 is in a state where an error is not detected. In this case, the second memory module 1300 may receive the alert signal.

In operation S130, the second memory module 1300 may perform a refresh operation on the second memory 1320. The second controller 1310 may trigger the alert signal and may perform a refresh operation on the second memory 1320. As described with reference to FIG. 3, a refresh operation count and a refresh operation method of the second controller 1310 are not limited. For example, a set refresh operation such as an auto refresh operation or a self-refresh operation may be performed.

In operation S140, the processor 1100 or the memory controller 1110 may perform a recovery operation in response to an error detected from the first memory module 1200, and in response to the corresponding alert signal. Here, the recovery operation means various operations for processing an error. For example, the memory controller 1110 may perform a recovery operation on a communication channel between the memory controller 1110 and the first memory module 1200. The recovery operation may include a ZQ calibration operation. In a first phase of the recovery operation, "all bank precharge" is performed; in the last phase of the recovery operation, "read with auto precharge" may be performed. A command/address parity error may again occur in the phases. In this case, the recovery operation may be repeated until the error is cleared. In addition, the memory controller 1110 may retransmit a command/address or data to the first memory module 1200 until the error is cleared.

Figure 6:
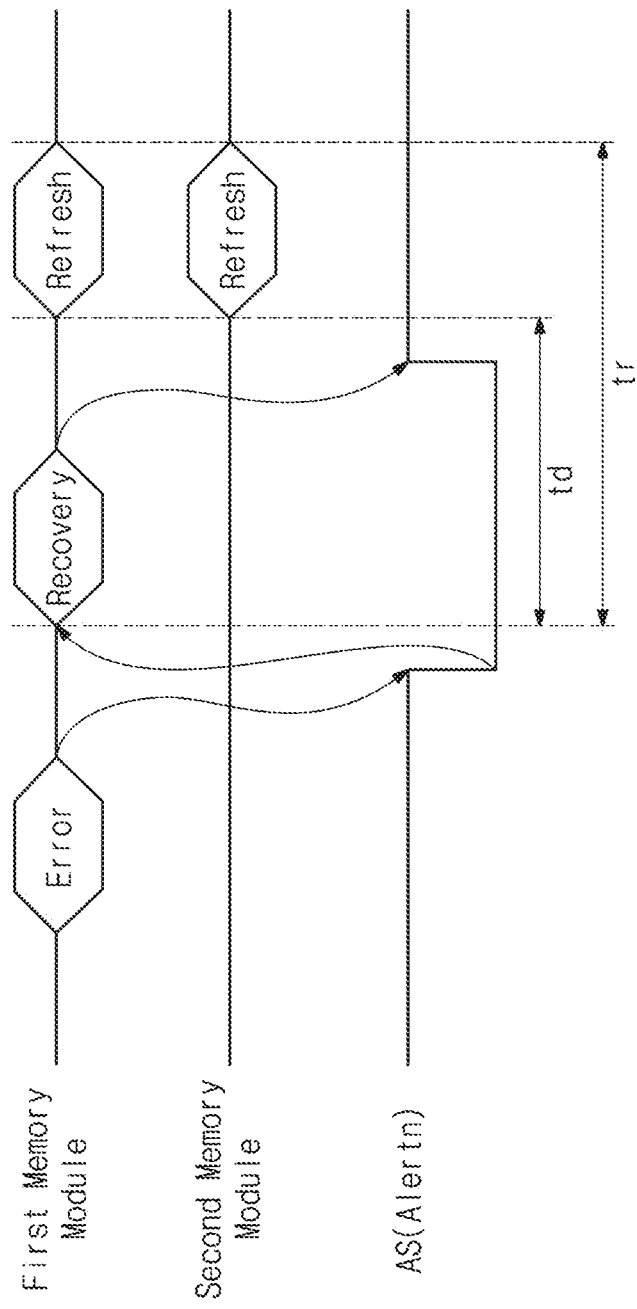
FIG. 6 is a timing diagram for describing an operation of a memory system in the case where a refresh operation based on an alert signal is not performed.

FIG. 6 is a timing diagram for describing an operation of a memory system in the case where a refresh operation based on an alert signal is not performed. A corresponding operation may be performed by a memory system, and for convenience of description, FIG. 6 will be described with reference to reference numerals/marks of FIG. 1.

The first memory module 1200 may detect an error through a parity check of a command/address received from the memory controller 1110 or through a cyclic redundancy check (CRC) of write data received from the memory controller 1110. In this case, the first memory module 1200 may output the alert signal AS (Alertn) to the alert channel. For example, the first memory module 1200 may output the alert signal AS of the low level to the alert channel, based on an error signal generated as an error is detected. The memory controller 1110 may receive the alert signal AS.

The memory controller 1110 may perform an operation for recovering an error, based on the alert signal AS. As described with reference to FIG. 5, the recovery operation may include various operations for processing an error, such as ZQ calibration, all bank precharge, read with auto precharge, and retransmission of a command/address or data. An error may again be detected during the recovery operation. In this case, the recovery operation may be repeated until an error is cleared. In the case where an error is cleared, the first memory module 1200 may not generate the error signal, and the alert signal AS may maintain the high level. The alert signal AS is illustrated as maintaining the low level while the recovery operation is performed in response to detection of an error, but the inventive concept is not limited thereto. For example, the alert signal AS may maintain the low level during a set time from a time at which an error is detected.

A time to recovery or process an error is defined as an error processing time "td". During the error processing time td, the memory controller 1110 may not perform a separate operation on the second to n-th memory modules 1300 to 1400 as well as the first memory module 1200. Here, the separate operation may include a read operation, a write operation, or a refresh operation, but is not limited thereto.

After clearing the error, the memory controller 1110 may provide a refresh command to the first to n-th memory modules 1200 to 1400. Because the refresh operation of the first to n-th memory modules 1200 to 1400 is delayed during the error processing time td, the refresh operation may be performed in a burst mode. A refresh periodic interval tr is set to secure stability of data stored in a volatile memory device. The first to n-th memory modules 1200 to 1400 are requested to perform a refresh operation during the refresh periodic interval tr.

In the case where an error repeatedly occurs, the error processing time td may increase. In this case, a time capable of performing a refresh operation during the refresh periodic interval tr decreases. For this reason, a refresh operation of a volatile memory device fails to be completely performed within the refresh periodic interval tr. To cope with this event, the processor 1100 or the memory controller 1110 may separately manage a refresh operation with regard to the second to n-th memory modules 1300 to 1400. However, in this case, because it is necessary to manage memory modules whenever an error is detected, a burden on a control of the processor 1100 may increase.

Figure 7:
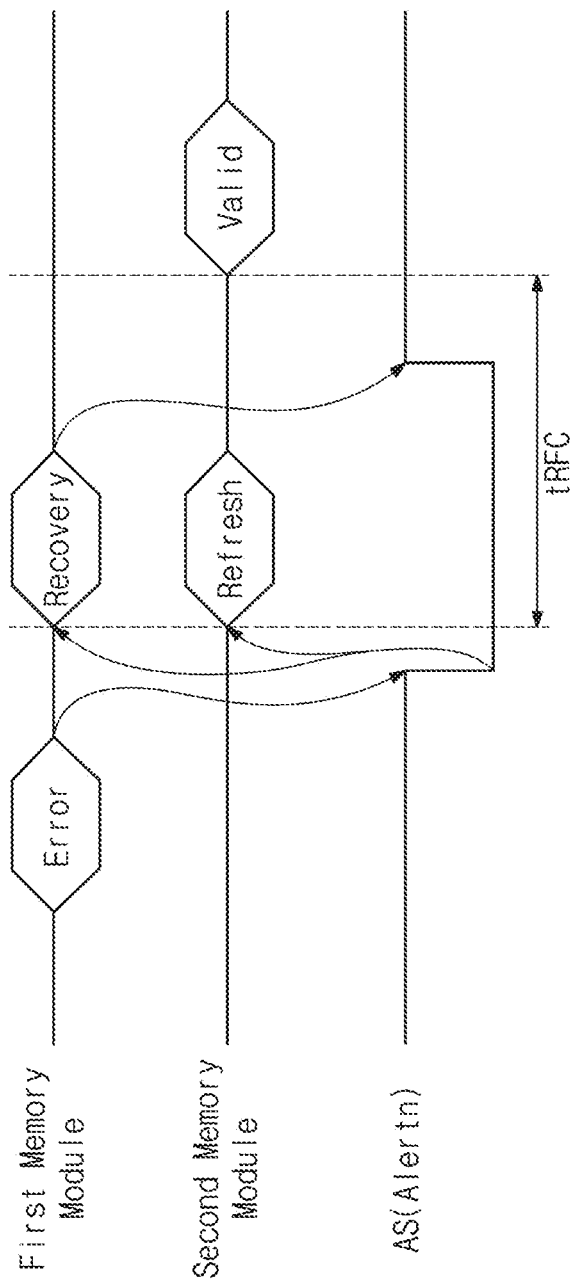
FIGS. 7 and 8 are timing diagrams for describing an operation of performing a refresh operation based on an alert signal according to an embodiment of the inventive concept.

FIG. 7 is a timing diagram for describing an operation of performing a refresh operation based on an alert signal according to an embodiment of the inventive concept. A corresponding operation may be performed by the memory system 1000 of FIG. 1. A description will be given with the assumption that a refresh operation of FIG. 7 is an auto refresh operation. For convenience of description, FIG. 7 will be described with reference to reference numerals/marks of FIGS. 1 and 3.

The first memory module 1200 may detect an error as described with reference to FIG. 6. When this happens, the first memory module 1200 may output a leading edge (high-to-low edge) of the alert signal AS (Alertn) to the alert channel. For example, when an error is detected, the first error detector 1211 may generate the error signal E1 of the high level. The first alert buffer circuit 1212 may operate as an output buffer based on the error signal E1 of the high level, may invert the error signal E1, and may output the alert signal AS of the low level to the alert channel.

The memory controller 1110 recognizes the alert signal AS of the low level. As described with reference to FIG. 6, the memory controller 1110 may perform an operation for recovering an error, based on the alert signal AS. Moreover, together with the recovery operation, the first controller 1210 may trigger the error signal E1 and may internally perform a refresh operation on the first memory 1220.

The second memory module 1300 recognizes the alert signal AS of the low level. Here, it is assumed that the second memory module 1300 is in a state where an error is not detected. Accordingly, the second alert buffer circuit 1312 may operate as an input buffer and may receive the alert signal AS. The second controller 1310 may trigger the alert signal AS and may internally perform a refresh operation on the second memory 1320. For example, the second memory module 1300 may perform the refresh operation once during a refresh cycle tRFC. The second memory module 1300 may increase a counting value and may perform the refresh operation corresponding to a next address during the refresh cycle tRFC. The number of times of execution of the refresh operation may be internally adjusted in the second memory module 1300. After the refresh cycle tRFC, a valid command Valid may be issued.

Because the second memory module 1300 internally performs the refresh operation based on the alert signal AS, the vulnerability of the delayed refresh operation described with reference to FIG. 6 may be improved. The second memory module 1300 may perform the refresh operation without waiting until an error of the first memory module 1200 is cleared. In this manner, the stability of data may be improved.

Figure 8:
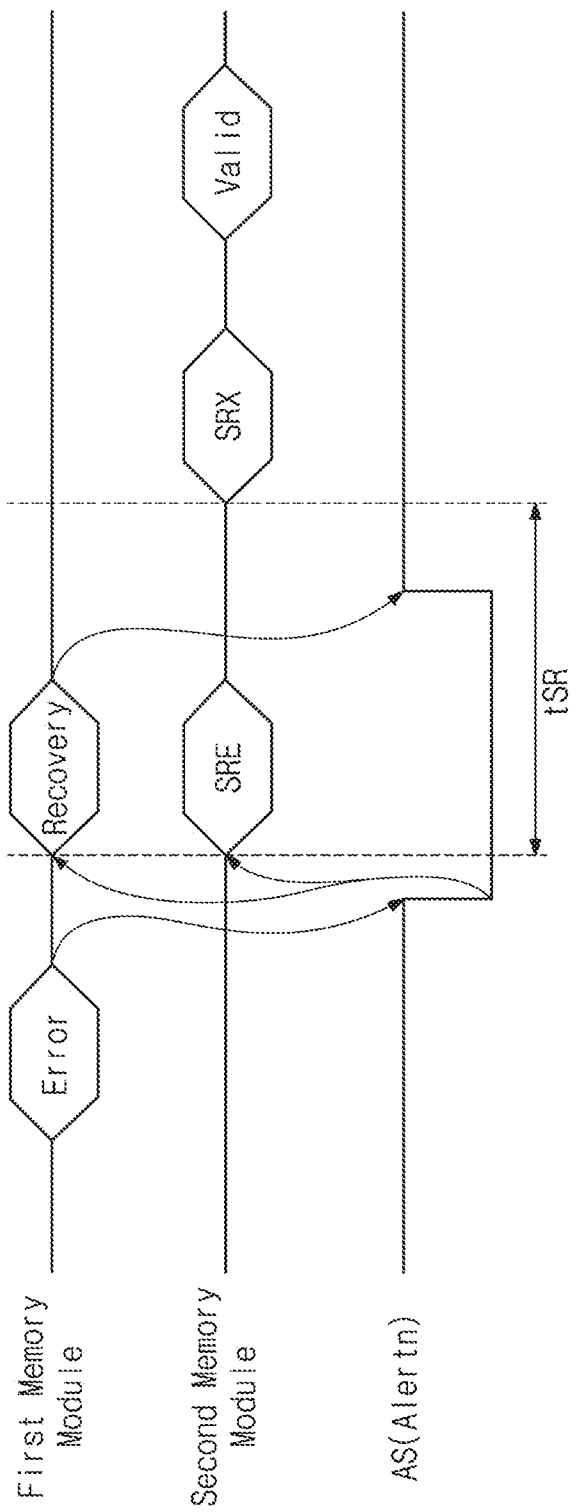

FIG. 8 is a timing diagram for describing an operation of performing a refresh operation based on an alert signal according to an embodiment of the inventive concept. A corresponding operation may be performed by the memory system 1000 of FIG. 1. A description is given under assumption that a refresh operation of FIG. 8 is a self-refresh operation. For convenience of description, FIG. 8 will be described with reference to reference numerals/marks of FIGS. 1 and 3.

The first memory module 1200 may detect an error as described with reference to FIGS. 6 and 7. In this case, the first memory module 1200 may output the alert signal AS (Alertn) of the low level to the alert channel. The memory controller 1110 may receive the alert signal AS. As described with reference to FIGS. 6 and 7, the memory controller 1110 may perform an operation for recovering an error, based on the alert signal AS.

The second memory module 1300 recognizes the alert signal AS of the low level. The second controller 1310 may perform the self-refresh operation on the second memory 1320, based on the alert signal AS. Upon receiving the alert signal AS, the second controller 1310 may perform the refresh operation on the second memory 1320, based on self-refresh information. The self-refresh information may include information about a time tSR to perform the self-refresh operation. The self-refresh information may include information about a following process, such as a time when a valid command is generated after the self-refresh operation.

In the self-refresh operation, because a buffer for receiving a clock signal from the outside is deactivated, the memory controller 1110 fails to intervene in the second memory module 1300 until the self-refresh operation is completed. Accordingly, information about the time tSR to perform the self-refresh operation may be necessary for the second memory module 1300 before the self-refresh operation is performed. This information may be provided from the processor 1100.

Because the second memory module 1300 performs the refresh operation based on the alert signal AS, the vulnerability of the self-refresh operation described with reference to FIG. 6 may be improved. The second memory module 1300 may perform the refresh operation without waiting until an error of the first memory module 1200 is cleared. Accordingly, the stability of data may be secured.

Figure 9:
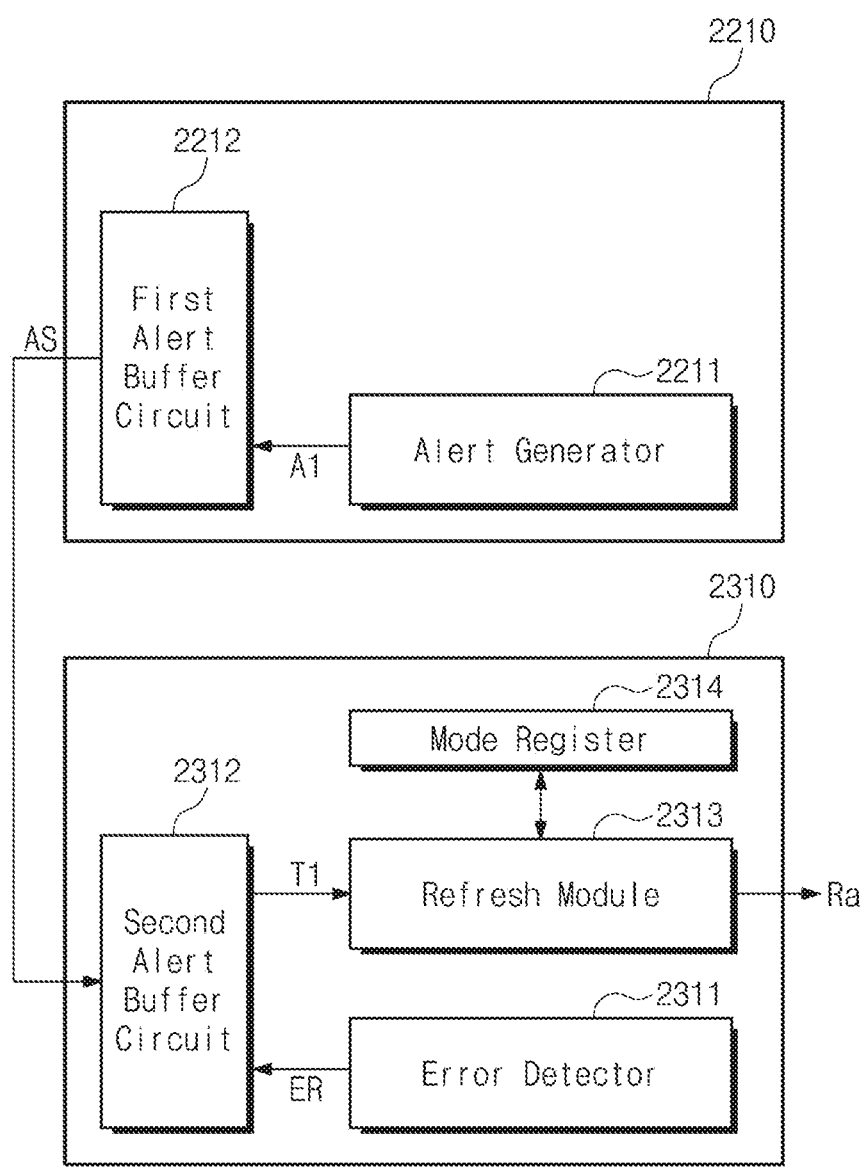
FIG. 9 is an exemplary block diagram of a controller included in a memory module illustrated in FIG. 1.

FIG. 9 is an exemplary block diagram of a controller included in a memory module illustrated in FIG. 1. FIG. 9 illustrates an example of a first controller 2210 and a second controller 2310 for describing how to generate the alert signal AS and perform a refresh operation according to the alert signal AS. Each of the first controller 2210 and the second controller 2310 may correspond to one of the first to n-th controllers 1210 to 1410 of FIG. 1. A memory corresponding to the first controller 2210 may be a nonvolatile memory device such as a phase change memory, and a memory corresponding to the second controller 2310 may be a volatile memory device such as a DRAM.

The first controller 2210 may include an alert generator 2211 and a first alert buffer circuit 2212. It is assumed that the first controller 2210 is included in the first memory module 1200 of FIG. 1. For convenience of description, the components included in the first controller 2210 are illustrated as separate blocks, but the placement of the components included in the first controller 2210 is not limited thereto. For example, in the first memory module 1200, the first alert buffer circuit 2212 may be separated from any other components of the first controller 2210 and may be positioned adjacent to an alert pin.

The alert generator 2211 may generate an activation signal A1 based on an operating condition of the first memory module 1200. The operating condition may be an index indicating a state of the first memory module 1200. For example, the operating condition may be a temperature of the first memory module 1200. In this case, the first memory module 1200 may include a temperature detector (not illustrated). When a temperature of the first memory module 1200 is out of a normal range, the alert generator 2211 may generate the activation signal A1, as shown by FIG. 9.

The alert generator 2211 may compare an operating condition of the first memory module 1200 and a reference condition and generate the activation signal A1 based on a comparison result. For example, the alert generator 2211 may compare a temperature of the first memory module 1200 and a reference temperature. The reference temperature may be a threshold value of a temperature at which a nonvolatile memory device may operate normally. When the temperature of the first memory module 1200 is higher than the reference temperature, the alert generator 2211 may output the activation signal A1 to the first alert buffer circuit 2212.

The first alert buffer circuit 2212 outputs the alert signal AS to the alert channel, based on the activation signal A1. The first alert buffer circuit 2212 is electrically connected to the alert channel through an alert pin. As in the first alert buffer circuit 1212 of FIGS. 3 and 4, upon receiving the activation signal A1, the first alert buffer circuit 2212 may operate as an output buffer. In this case, the first alert buffer circuit 2212 may prevent a signal provided to the first memory module 1200 through the alert channel from being received.

When the operating condition belongs to the normal range, the first alert buffer circuit 2212 may operate as an input buffer, but the inventive concept is not limited thereto. In the case where the first memory module 1200 includes a nonvolatile memory device, a refresh operation may not be required. Accordingly, the first alert buffer circuit 2212 may not operate as an input buffer and may not receive an alert signal from any other memory module.

The alert signal AS may be provided to the second controller 2310 and the memory controller 1110 of FIG. 1. The memory controller 1110 may control the first memory module 1200 based on the alert signal AS such that a temperature of the first memory module 1200 decreases. For example, the memory controller 1110 may control the first memory module 1200 such that the first memory module 1200 operates in a low-power mode.

The memory controller 1110 of FIG. 1 may not perform a separate operation on the other memory modules until the first memory module 1200 satisfies a normal operating condition. Here, the separate operation may include a read operation, a write operation, or a refresh operation of the second memory module 1300, for example. In in this case, as described above, a refresh operation of the second memory module 1300 may be delayed, thus making the stability of data relatively low. To solve this issue, the first controller 2210 may provide an alert signal to the second controller 2310 in some embodiments of the inventive concept.

The second controller 2310 may include an error detector 2311, a second alert buffer circuit 2312, a refresh module 2313, and a mode register 2314. It is assumed that the second controller 2310 is included in the second memory module 1300 of FIG. 1. The error detector 2311, the second alert buffer circuit 2312, the refresh module 2313, and the mode register 2314 may be substantially identical to the second error detector 1311, the second alert buffer circuit 1312, the second refresh module 1313, and the second mode register 1314 of FIG. 3.

The error detector 2311 may detect an error based on a parity check of a command/address or a cyclic redundancy check (CRC), or use another error detection algorithm. The error detector 2311 may generate an error signal or a normal signal ER, based on whether an error is detected. The error signal or the normal signal ER is provided to the second alert buffer circuit 2312.

The second alert buffer circuit 2312 may receive the alert signal AS from the alert channel, based on an error detection result of the error detector 2311. As described with reference to FIG. 3, the second alert buffer circuit 2312 may operate as an output buffer when an error is detected and may operate as an input buffer when an error is not detected. When an error is not detected, the alert signal AS generated from the first controller 2210 may be recognized by the second controller 1310. The second alert buffer circuit 1312 may provide the trigger signal T1, which is generated based on the alert signal AS, to the refresh module 2313.

The refresh module 2313 may allow a volatile memory device to perform a refresh operation, based on the alert signal AS. Accordingly, depending on an abnormal operating condition of the first memory module 1200, a refresh operation of the second memory module 1300 may not be delayed, and stability of data stored in the volatile memory device may be secured. Also, as the second memory module 1300 internally performs the refresh operation, a burden on a control of the memory controller 1110 may decrease. The refresh module 2313 may perform the refresh operation with reference to the information set to the mode register 2314.

Figure 10:
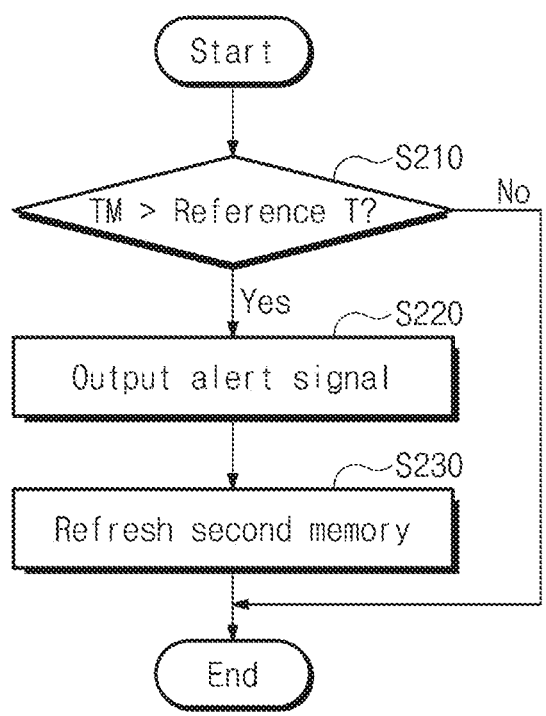
FIG. 10 is a flowchart associated with an operating method of a memory system described with reference to FIG. 9.

FIG. 10 is a flowchart associated with an operating method of a memory system described with reference to FIG. 9. A corresponding method may be performed by a memory system including first and second controllers 2210 and 2310 of FIG. 9. For convenience of description, FIG. 10 will be described with reference to reference marks/numerals of FIG. 9.

In operation S210, the first controller 2210 may compare an operating condition of a first memory module and a reference condition. For example, the first controller 2210 may compare a measured temperature TM of the first memory module and a reference temperature. The reference temperature may be a threshold value of a temperature at which the first memory module may operate normally. When the temperature TM of the first memory module is higher than the reference temperature, operation S220 is performed. When the temperature TM of the first memory module is not higher than the reference temperature, the first controller 2210 does not generate the alert signal AS and operates normally.

In operation S220, the first controller 2210 may output the alert signal AS to the alert channel through an alert pin. For example, when the temperature TM of the first memory module is higher than the reference temperature, the alert generator 2211 may generate the activation signal A1, and the first alert buffer circuit 2212 may output the alert signal AS based on the activation signal A1. The alert signal AS may be input to the second controller 2310 and the memory controller 1110 of FIG. 1.

In operation S230, the second controller 2310 may perform a refresh operation on volatile memory device. The second controller 2310 may trigger the alert signal AS and may perform a refresh operation on the volatile memory device. As described above, a refresh operation count and a refresh operation method are not limited, and the second controller 2310 may perform a set refresh operation such as an auto refresh operation or a self-refresh operation. In this case, under control of the memory controller 1110, the first controller 2210 may perform an operation for decreasing the temperature TM of the first memory module.

Figure 11:
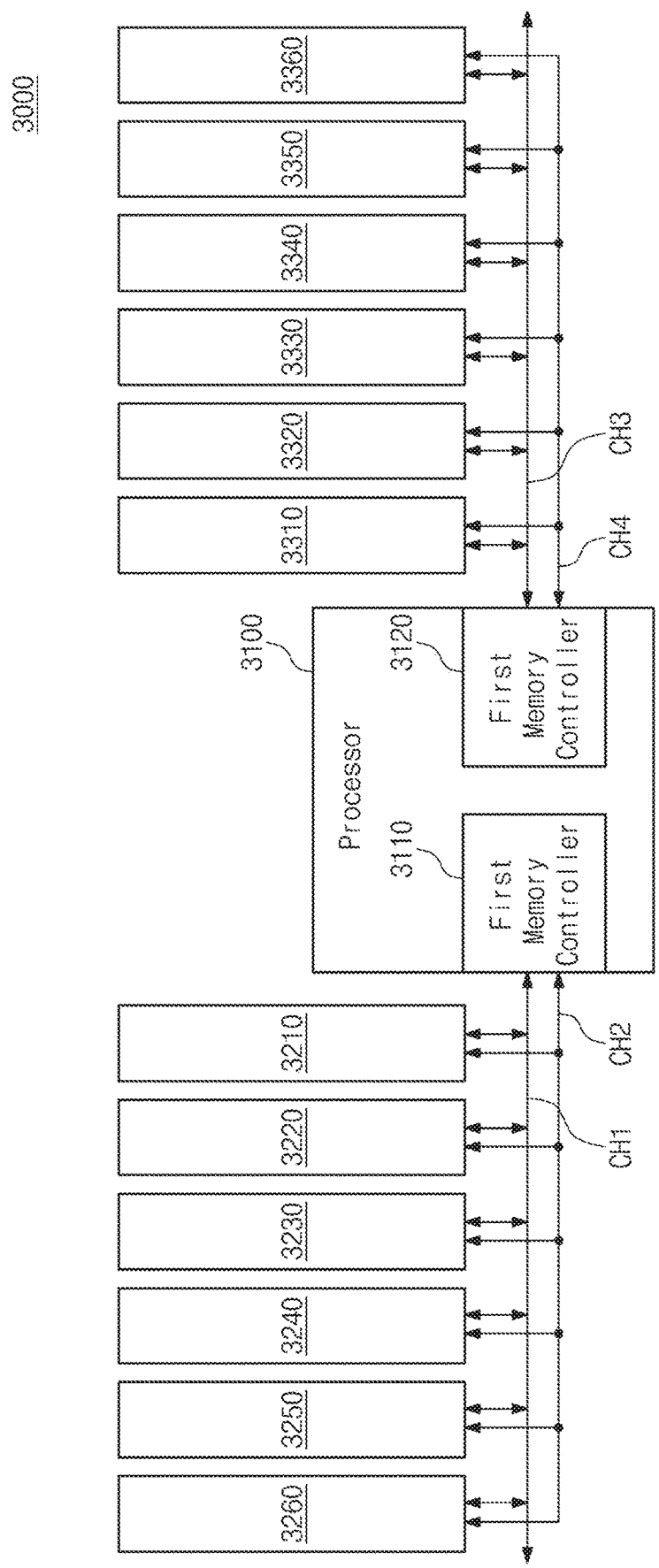
FIG. 11 is an exemplary block diagram of a memory system according to an embodiment of the inventive concept.

FIG. 11 is an exemplary block diagram of a memory system according to an embodiment of the inventive concept. Referring to FIG. 11, a memory system 3000 may include a processor 3100 and a plurality of memory modules 3210 to 3260 and 3310 to 3360.

The processor 3100 may control components of the memory system 3000 and operations of the components. The processor 3100 may include a first memory controller 3110 and a second memory controller 3120. The first memory controller 3110 may access first to sixth memory modules 3210 to 3260 through the first channel CH1 or the second channel CH2. The second memory controller 3120 may access seventh to twelfth memory modules 3310 to 3360 through a third channel CH3 or a fourth channel CH4.

The plurality of memory modules 3210 to 3260 and 3310 to 3360 may be used as a main memory of the memory system 3000. The plurality of memory modules 3210 to 3260 and 3310 to 3360 may communicate with the first memory controller 3110 and the second memory controller 3120 in compliance with one of standards of memory modules such as a dual in-line memory module (DIMM), a registered DIMM (RDIMM), and a load reduced DIMM (LRDIMM). As described with reference to FIG. 1, the plurality of memory modules 3210 to 3260 and 3310 to 3360 may include a DRAM, and at least a part of the plurality of memory modules 3210 to 3260 and 3310 to 3360 may include a memory, which is different in type from the DRAM, such as a phase change memory.

The first to sixth memory modules 3210 to 3260 may be connected to the first memory controller 3110 through the first channel CH1 or the second channel CH2. The first channel CH1 may include channels respectively dedicated to the first to sixth memory modules 3210 to 3260. The second channel CH2 may be shared by the first memory controller 3110 and the first to sixth memory modules 3210 to 3260, and may include an alert channel. In the case where an error is detected from any one of the first to sixth memory modules 3210 to 3260 or an operating condition is out of a reference condition, an alert signal may be output to the alert channel. In this case, memory modules including a DRAM among the first to sixth memory modules 3210 to 3260 may trigger an alert signal to perform a refresh operation.

The seventh to twelfth memory modules 3310 to 3360 may be connected to the second memory controller 3120 through the third channel CH3 or the fourth channel CH4. The third channel CH3 may include channels respectively dedicated to the seventh to twelfth memory modules 3310 to 3360. The fourth channel CH4 may be shared by the second memory controller 3120 and the seventh to twelfth memory modules 3310 to 3360, and may include an alert channel. In the case where an error is detected from any one of the seventh to twelfth memory modules 3310 to 3360 or an operating condition is out of a reference condition, an alert signal may be output to the alert channel. In this case, memory modules including a DRAM among the seventh to twelfth memory modules 3310 to 3360 may trigger an alert signal to perform a refresh operation.

According to an embodiment of the inventive concept, as any other memory module perform a refresh operation based on an alert signal output from a specific memory module, vulnerability of a refresh operation according to an operating state may be improved, and a burden on a control of a processor or a memory controller associated with a refresh operation may decrease.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A memory system comprising:
   a memory device having a plurality of volatile memory modules therein; and
   a memory controller electrically coupled to the plurality of volatile memory modules, said memory controller configured to correct an error in a first of the plurality of volatile memory modules in response to generation of an alert signal by the first of the plurality of volatile memory modules, concurrently with an operation to refresh at least a portion of a second of the plurality of volatile memory modules in response to the generation of the alert signal, which is provided from the first of the plurality of volatile memory modules to the second of the plurality of volatile memory modules.

2. The memory system of claim 1, wherein the first of the plurality of volatile memory modules comprises an alert buffer circuit configured to generate the alert signal as a second alert signal, which is provided onto a channel that is electrically coupled to the memory controller, the first of the plurality of volatile memory modules and the second of the plurality of memory modules, in response to a first alert signal generated within the first of the plurality of volatile memory modules; and wherein the error in the first of the plurality of volatile memory modules is corrected concurrently with the operation to refresh at least a portion of the second of the plurality of volatile memory modules.

3. The memory system of claim 2, wherein the alert buffer circuit comprises:
   an output buffer configured to generate the second alert signal in response to the first alert signal; and
   an input buffer, which is disabled by the first alert signal.

4. The memory system of claim 3, wherein said output buffer is disabled and said input buffer is enabled when the first alert signal is inactive.

5. The memory system of claim 1, further comprising:
   a processor comprising the memory controller, said processor configured to transfer write data to the first of the plurality of volatile memory modules and to retransfer the write data to the first of the plurality of volatile memory modules in response to the alert signal.

6. The memory system of claim 5, wherein each of the first and second of the plurality of volatile memory modules comprises a respective error detector and refresh module therein.

7. A memory system comprising:
   a first memory module including a nonvolatile memory device and a first controller configured to generate an alert signal based on an operating condition of the nonvolatile memory device that reflects an error in write data provided to the nonvolatile memory device;
   a second memory module including a volatile memory device and a second controller configured to refresh the volatile memory device in response to the alert signal generated by the first memory module; and
   a memory controller configured to control the first memory module and the second memory module, and further configured to correct the error in the write data provided to the nonvolatile memory device concurrently with the refresh of the volatile memory device, which is synchronized with the generation of the alert signal by the first memory module.

8. The memory system of claim 7, wherein the first controller includes:
   an alert generator configured to generate an activation signal based on a result of comparing the operating condition and a reference condition; and
   an alert buffer circuit configured to output the alert signal based on the activation signal.

9. The memory system of claim 7, wherein the operating condition includes a temperature of the nonvolatile memory device, and wherein, when the temperature is higher than a reference temperature, the first controller outputs the alert signal.

10. The memory system of claim 7, wherein the second controller includes:
   an error detector configured to detect an error of the volatile memory device;
   an alert buffer circuit configured to block a signal input to the second memory module from an alert channel transferring the alert signal when the error is detected, and to block a signal output from the second memory module to the alert channel when the error is not detected; and
   a refresh module configured to refresh the volatile memory device based on the alert signal.

11. The memory system of claim 7, wherein the nonvolatile memory device includes a phase change memory.

12. A method of operating a memory device having a plurality of volatile memory modules therein, comprising:
   generating a first alert signal in response to detecting an error in write data received by a first of the plurality of volatile memory modules; and
   commencing a recovery operation to correct the write data concurrently with an operation to refresh a second of the plurality of volatile memory modules, in-sync with a leading edge of the first alert signal, which is generated by the first of the plurality of volatile memory modules.

13. The method of claim 12, wherein said commencing is followed by generating a trailing edge of the first alert signal upon conclusion of the recovery operation.

14. The method of claim 12, wherein said generating a first alert signal comprises disabling an input path of an alert buffer circuit in-sync with a leading edge of the first alert signal.

15. The method of claim 14, wherein said generating a first alert signal comprises generating a second alert signal in-sync with the first alert signal; and wherein the operation to refresh the second of the plurality of volatile memory modules is preceded by transferring the second alert signal to the second of the plurality of volatile memory modules.

* * * * *